United States Patent [19]
Lestician

[11] Patent Number: 5,880,677
[45] Date of Patent: Mar. 9, 1999

[54] SYSTEM FOR MONITORING AND CONTROLLING ELECTRICAL CONSUMPTION, INCLUDING TRANSCEIVER COMMUNICATOR CONTROL APPARATUS AND ALTERNATING CURRENT CONTROL APPARATUS

[76] Inventor: Guy J. Lestician, 636 E. Franklin St., Trenton, N.J. 08610

[21] Appl. No.: 730,715

[22] Filed: Oct. 15, 1996

[51] Int. Cl.[6] ............................................. G08C 19/00
[52] U.S. Cl. ........................ 340/825.06; 340/310.02; 340/825.62; 340/825.69; 340/310.06; 340/870.02; 340/870.11; 340/870.31; 340/870.33; 307/3; 307/41; 307/17; 307/38; 324/127
[58] Field of Search .................... 340/310.02, 825.62, 340/825.69, 310.06, 825.06, 870.02, 870.03, 870.11, 870.31, 870.33; 307/3, 41, 17, 38; 324/127

[56] References Cited

U.S. PATENT DOCUMENTS

| | | | |
|---|---|---|---|
| 3,906,242 | 9/1975 | Stevenson | 307/38 |
| 4,163,218 | 7/1979 | Wu | 340/310 A |
| 4,174,517 | 11/1979 | Mandel | 340/310.02 |
| 4,644,320 | 2/1987 | Carr et al. | 340/310.06 |
| 4,914,383 | 4/1990 | Wilkerson | 324/127 |
| 5,420,741 | 5/1995 | Ushiyama et al. | 361/146 |
| 5,432,710 | 7/1995 | Ishimaru et al. | 364/493 |
| 5,436,513 | 7/1995 | Kay et al. | 307/71 |
| 5,459,459 | 10/1995 | Lee, Jr. | 340/870.02 |
| 5,462,225 | 10/1995 | Massara et al. | 236/47 |
| 5,483,672 | 1/1996 | Sasuta | 455/54.1 |
| 5,495,129 | 2/1996 | Schou et al. | 307/17 |
| 5,512,831 | 4/1996 | Cisar et al. | 324/426 |
| 5,517,188 | 5/1996 | Carroll et al. | 340/825.54 |
| 5,528,123 | 6/1996 | Hutchison | 323/205 |

*Primary Examiner*—Michael Horabik
*Assistant Examiner*—Yves Dalencourt
*Attorney, Agent, or Firm*—Kenneth P. Glynn, Esq.

[57] ABSTRACT

A system that monitors and controls electrical power consumption that will be retrofitted to a typical consumer electrical power arrangement (typical arrangement-electrical feed line from a provider, a meter, a circuit breaker and individual input wiring to a plurality of electrical devices, appliances and outlets). The system includes a control unit which receives information from an electromagnetic pickup device from which real time electrical consumption is determined over very short periods of time. The control unit has a main data processing and storage processor for retaining information and it may include a communication microprocessor for sending signals to corresponding modules. The electromagnetic pickup device uniquely measures the electromagnetic flux emanating at each output wire from each of the individual circuit breakers in a breaker box. The modules have filters which release electrical power to the individual electrical devices, appliances and outlets at a controlled, economic rate.

17 Claims, 6 Drawing Sheets

SYSTEM FOR MONITORING AND CONTROLLING ELECTRICAL CONSUMPTION, INCLUDING TRANSCEIVER COMMUNICATOR CONTROL APPARATUS AND ALTERNATING CURRENT CONTROL APPARATUS

BACKGROUND OF THE INVENTION

1. Field of the Invention

The present invention relates to conservation of electrical energy consumption by consumers using retrofitted control devices which rely upon monitoring of magnetic fluxes at selected locations in the system.

2. Information Disclosure Statement

The following references are examples of the prior art relating to control of electrical energy consumption:

U.S. Pat. No. 4,163,218 relates to an electronic control system for controlling the operation of a plurality of electrical devices which are energized from AC power lines which includes a single, central unit connected to the power lines, which further includes a central transceiver means for transmitting an encoded oscillating signal of one frequency onto the power lines, a central encoding means for encoding the oscillating signal with an encoded signal in synchronization with the frequency of the AC power for selective control of electrical devices, and a central control means connected to the encoding means for selecting the electrical device to be controlled and its desired state. The invention further includes unitary switch units respectively interconnected between power lines and each electrical device being operative for both local and centralized control of the electrical device with the local control and the centralized control placing the electrical device in respective opposite states from each other, each switch unit including a switch transceiver means for receiving the encoded oscillating signal from the power lines, a switch decoding means coupled to the switch transceiver means for detecting the encoded signal, a switch control means connected to the switch decoding means for setting the selected electrical devices to the desired state, and a local control means for selectively locally operating the electrical device independently of the central unit and placing the electrical device in a state opposite from that which it was placed by the central unit.

U.S. Pat. No. 5,420,741 relates to an arrangement for obtaining flux rate information in a magnetic circuit including passive means connected across a flux rate sensor for implementing control of said flux rate. The passive means being a tuned magnetic flux rate feedback sensing and control arrangement wherein impedance is tuned and the energy loss characteristic is adjustable. The selection of inductance and capacitance values provides tuning and the selection of resistance affects the energy loss characteristics.

U.S. Pat. No. 5,432,710 is directed to an energy supply system for supplying, in system interconnection, power received at a power receiving equipment from a power plant and power generated by a fuel cell to a power consuming installation, and supplying heat generated by the fuel cell to a heat consuming installation. This system includes an operation amount computing device for computing an amount of operation of the fuel cell to minimize an equation $y = a \times L + b \times M + c \times N$, in response to an energy demand of the power consuming installation and heat consuming installation. A control device controls the fuel cell to satisfy the amount of the operation computed. The system supplies energy in optimal conditions with respect to the cost borne by an energy consumer, consumption of primary energy, and release of environmental pollutants. Energy is effectively used from the standpoint of the energy consumer and a national point of view.

U.S. Pat. No. 5,436,513 relates to an information handling system which is described as having a power supply and having a switching circuit that switches a plurality of energy sources between series and parallel couplings. Associated with the switching circuit is a voltage level detecting circuit for monitoring the voltage level of the energy sources. A processor for controlling the information handling system responds to the voltage level detecting circuit and in the event of a low voltage condition, the processor activates the switching circuit to switch the energy sources and from a series to a parallel coupling. Alternatively, processor responds to other inputs or conditions for actuating switching circuit.

U.S. Pat. No. 5,459,459 is directed to an algorithm for implementation in a meter register and a reading device. In the one embodiment, the invention enables selecting a display table to be read from the register, updating the billing read date and time in the register, reversing the order in which load profile data is transmitted from the register to the reader, specifying the number of load profile intervals to be read from the register, and specifying the number intervals to skip when reading from the register.

U.S. Pat. No. 5,462,225 relates to an apparatus and method for controlling energy supplied to a space conditioning load and for overriding a load control operation in response to measuring certain space temperatures within a closed environment. The load control apparatus includes a control device connected to an electrical distribution network and to a space/conditioning load and a temperature sensing device connected to the control device. The control device conducts a load shedding operation to control distribution of electrical energy to the space conditioning load in response to command signals supplied by a remote command center. The temperature sensing device operates to override the load shedding operation by outputting a control override signal to the control device in response to sensing certain space temperatures within the closed environment. If the temperature control device is connected to an air conditioning system, the temperature sensing device causes the control device to terminate the load shedding operation prior to expiration of a selected time period in response to measuring a space temperature that exceeds a maximum space temperature limit. In contrast, if the temperature control device is connected to a forced air heating system, the temperature sensing device causes the control device to terminate the load shedding operation when a measured space temperature drops below a minimum space temperature limit. The maximum space temperature limit is greater than the control temperature setpoint of a thermostat that controls the space conditioning operations, whereas the minimum space temperature limit is less than the control temperature setpoint.

U.S. Pat. No. 5,483,672 relates to a communication system, where a communication unit may conserve source energy when it is inactive in the following manner. The control channel is partitioned into a predetermined number of windows and a system window which are transmitted on the control channel in a round robin manner. When the communication unit registers with the communication system, it is assigned to a window group. The communication unit then monitors only the system window to determine whether the window group that its been assigned to is also assigned to one of the predetermined number of windows.

When the window that has been assigned to the window group is being transmitted to the control channel, the communication unit activates to monitor that window. Once the window is no longer being transmitted, the communication unit deactivates until the system window is being transmitted or the window assigned to the window group is being transmitted.

U.S. Pat. No. 5,495,129 relates to an electronic device for multiplexing several loads to the terminals of a source of alternating electrical energy. The source of alternating electrical energy is coupled by electromagnetic flux to the loads by using primary excitation windings and connect to the terminals of the source of alternating electrical energy and secondary windings respectively corresponding to the number of loads. The secondary windings are at least partially coupled to the primary winding and are each connected to the terminals of a load. The coupling is inhibited by auxiliary winding which are each totally coupled with the secondary winding. The inhibition function is controlled in order to inhibit all the magnetic couplings except for one and this particular one changes as a function of the respective load to be coupled to the source of alternating electrical energy.

U.S. Pat. No. 5,512,831 relates to a system for testing electrochemical energy conversion and storage devices includes means for sensing the current from the storage device and varying the load across the storage device in response to the current sensed. The system is equally adaptable to batteries and fuel cells. Means is also provided to sense system parameters from a plurality of locations within the system. Certain parameters are then stored in digital form for archive purposes and certain other parameters are used to develop control signals in a host processor.

U.S. Pat. No. 5,517,188 is directed to a programmable identification apparatus, and associated method, includes a transceiver and a transponder. The transponder is powered by the energy of a transceiver transmit signal generated by the transceiver and includes a programmable memory element. A coded sequence which uniquely identifies the transponder is stored in the programmable memory element and, when the transponder is powered, the transponder generates a transponder signal which includes the coded sequence stored in the programmable memory element, once modulated by circuitry of the transponder. When the transceiver transmit signal generated by the transceiver circuitry is of certain signal characteristics, the coded sequence stored in the programmable element is erased, and a substitute coded sequence, which also forms a portion of the transceiver transmit signal, is stored in the programmable memory element. Storage of the coded sequence in the programmable memory element is, hence, effectuated merely by application of a transceiver transmit signal of certain characteristics to the transponder.

U.S. Pat. No. 5,528,123 measures the total line current in a power cord which is used to energize both a power factor corrected system and non-power factor corrected AC loads. The power factor control loop of the power factor corrected system is then driven to correct the power factor of total line current in the power cord ideally to approach unity.

Notwithstanding the above prior art, there are no teachings or suggestions that would render the present invention anticipated or obvious.

SUMMARY OF THE INVENTION

The present invention is directed to a system that monitors and controls electrical power consumption which will be retrofitted to existing consumers electrical power arrangements. Such typical arrangements normally include an electrical feed line from a provider, a meter, a circuit breaker and individual output wiring to a plurality of electrical devices, appliances and outlets. The present invention includes a control unit, which receives information from an electromagnetic pickup device from which real time electrical consumption is determined, and from which current and subsequent voltage are monitored. The control unit includes a main storage microprocessor for retaining information and includes a communications microprocessor for sending signals to modules and may include additional microprocessors for additional functions. There is also an electromagnetic pickup device which is adapted to be connected to the output side of wiring of individual circuit breakers. This measures the electromagnetic flux emanating at each output wire from each of the individual circuit breakers in a breaker box. The electromagnetic pickup device provides electromagnetic flux measurements to and is connected to the control unit. A plurality of modules are connected to wiring to selected electrical devices, appliances and outlets and are electronically connected to the control unit through normal electrical wiring. Each of the plurality of modules correspond to an individual circuit breaker electromagnetic flux reading storage of the control unit. Each of the modules have electrical power filters for release of power to the individual electrical devices, appliances and outlets to which they are connected. In some preferred embodiments, the system also includes connection to one or more remote computers for analysis, control, adjustment and even commercial billing purposes. In other embodiments, the control unit is connected to telephone lines for wide area networking so as to be adaptable for adjustment and/or response to commands from remote locations by telephone. In yet other embodiments, both the computer and the telephone connections are included in the foregoing.

BRIEF DESCRIPTION OF THE DRAWINGS

The present invention should be more fully understood when the specification herein is taken in conjunction with the drawings appended hereto, wherein.

DETAILED DESCRIPTION OF THE PRESENT INVENTION

In a normal electrical power consumption situation, electricity is transmitted through power lines or transmission lines to the home, office, factory or other consumers, wherein the main line is typically connected to an electrical meter, and from the meter to a main breaker box 13 (or, in earlier times, a main fuse box). Within the main breaker box 13, the main power line is connected to a plurality of individual circuit breakers which then lead to various power consumption facilities such as heating, air conditioning, lighting and electrical outlets. While this arrangement works adequately to provide electrical power to the consumer, it is inefficient because many electrically powered devices and appliances consume more power than necessary and, additionally, they experience spikes, surges and phase shifts, which make the overall system inefficient and uneconomic.

The present invention relates to systems which are retrofitted to existing electrical power arrangements for the purpose of reducing unnecessary electrical power waste and losses by reducing or eliminating spikes, surges and phase problems with continuous monitoring, feedback and control at individual power consumption points.

Figure 1:
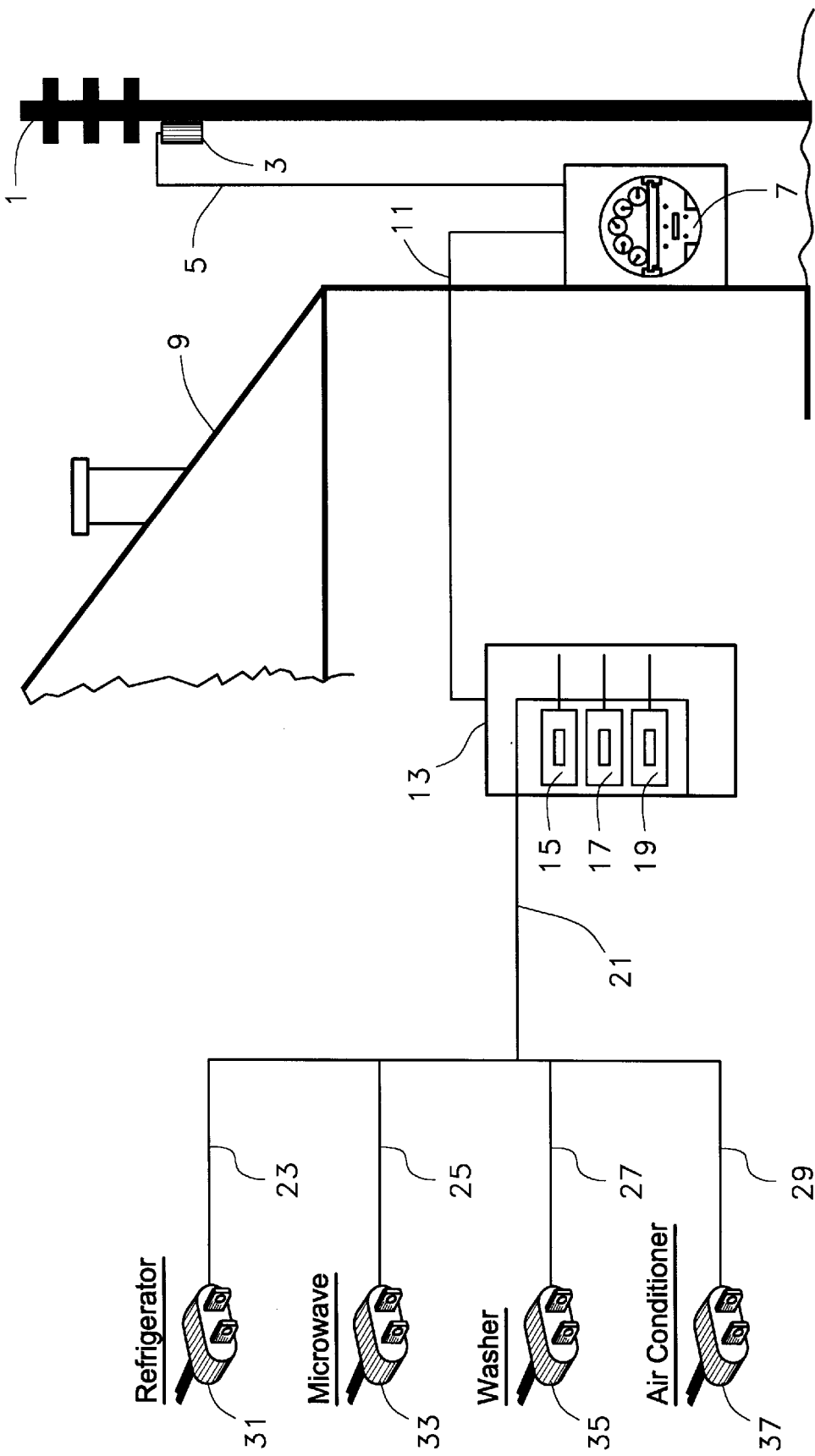
FIG. 1 illustrates a schematic drawing of a typical electrical energy consumer arrangement from a public utility.

FIG. 1 illustrates a typical electric power consumer arrangement. Telephone line pole 1 symbolically represents an electric distribution system from a public utility. At various locations along the distribution systems are transformers such as transformer 3 main electrical line 5 enters electric meter 7 and then enters building 9 via main line 11. Main line 11 feeds electricity to main breaker box 13, which is distributed through various individual circuit breakers typified by breakers 15, 17 and 19. The individual breakers are wired to provide electricity to various electrical devices, appliances and outlets. This is represented by typical indoor alternating current 110 to 280 voltage line 21 to various outlets 23, 25, 27 and 29, into which refrigerator plug 31, microwave plug 33, washer plug 35 and air conditioner plug 37 are connected.

Figure 2:
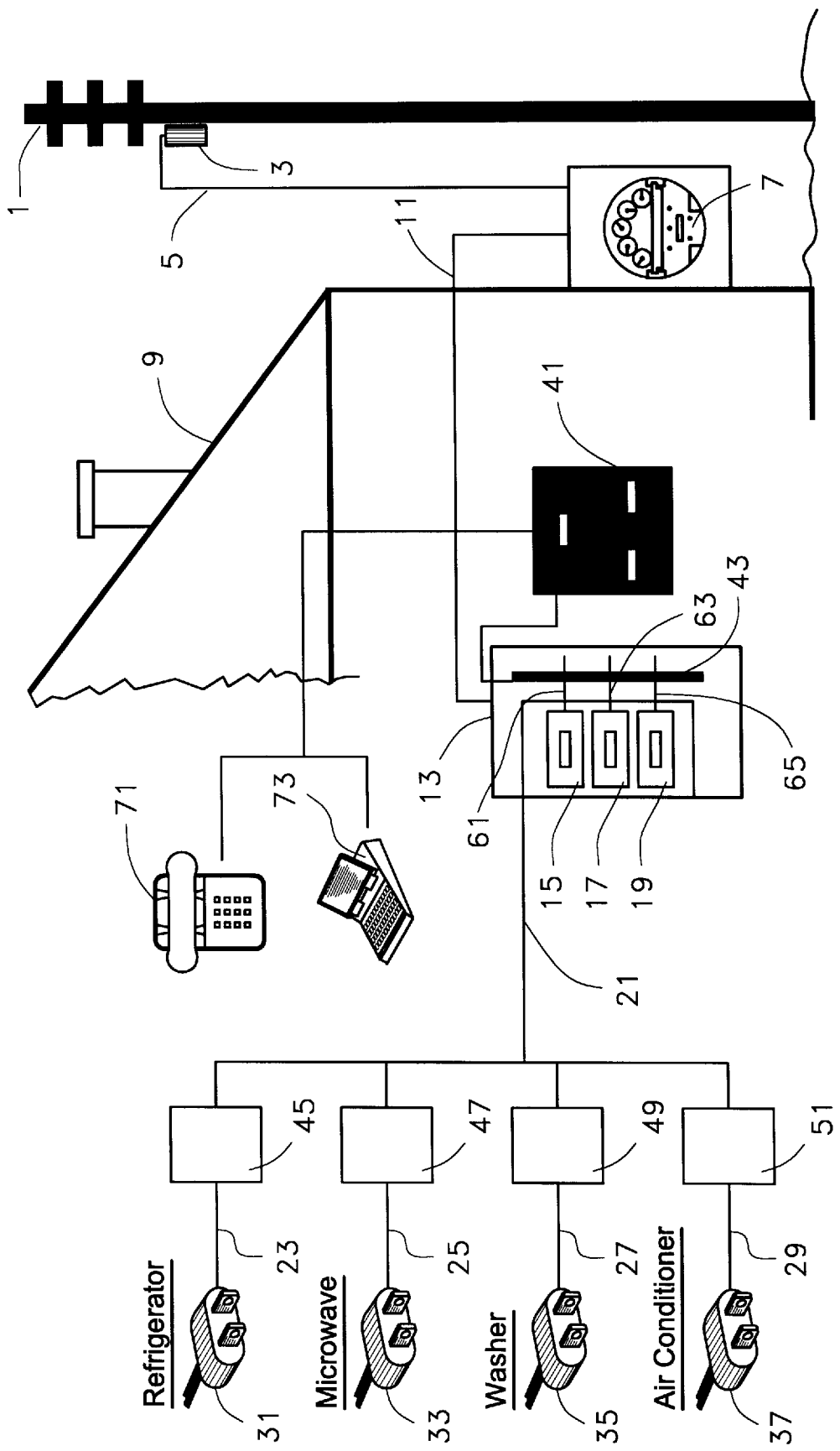
FIG. 2 shows a schematic illustration of a present invention system for conserving energy consumption utilizing external modules.

FIG. 2 shows a schematic illustration of a present invention system for conserving energy consumption utilizing external modules. The typical electrical power arrangement illustrated in FIG. 1 is repeated in FIG. 2 with identical parts identically numbered. Additionally, there is shown the three essential components of the present invention system, namely a control unit 41, an electromagnetic pickup device 43 and a plurality of external plug modules illustrated as modules 45, 47, 49 and 51. The plurality of external modules 45, 47, 49 and 51 include filtering, which is discussed in more detail with respect to FIGS. 5 and 6 below.

The electromagnetic pickup device 43 uniquely measures the electromagnetic flux emanating at each output wire 61, 63 and 65 from each of the individual circuit breakers 15, 17 and 19, respectively, in a breaker box 13. This information is fed to the control unit 41 from which real time electrical consumption is determined. That is, current and subsequent voltage are monitored continuously or continually over very short periods of time. The control unit 41 includes a main data processing and storage microprocessor for retaining information and includes a communications microprocessor for sending signals to corresponding modules such as modules 45, 47, 49 and 51 to activate the modules to filter the release of power to the individual electrical devices and appliances represented by plugs 31, 33, 35 and 37.

Control Unit

Control unit 41 is the heart of the system. This control unit 41 uses at least two microprocessors described above for data processing and storage and for communications. With the incoming processed data, the control unit 41 then sends the appropriate information or response to appropriate modules of the system. In one embodiment, the control unit 41 uses three independent microprocessors to receive and process information, the third microprocessor being used to be connected to and communicate with optional external control devices, such as telephone (with modem) 71, and/or computer 73. Thus, telephone modems and computers may be utilized to adjust the control unit 41's software, to take consumption readings, to turn off or turn on appliances, to dim lights or to otherwise alter the programs, content and/or operation of control unit 41.

The control unit 41 will communicate with the electromagnetic pickup device 43 via a data cable linked to a port (not shown) on the side of the control unit 41. The control unit 41 will also communicate with the external phase modules via a data modulating protocol response that utilizes the facility's present electrical system, e.g. wire 21 and connected wires, as the data highway. The control unit 41 will have its own software burned into its circuit boards. In preferred embodiments, this software is programmed to respond only to keyed input software to prevent unauthorized use or tampering. The control unit 41's microprocessors will communicate directly with the software of incoming signals from telephone (with modem) 71 and/or computer 73, to make the system "smart" as well as respond to any given electrical impulse or change to assist in the reprogramming of its earlier program to an updated version of the program, e.g. to enhance efficiency.

The electromagnetic pickup device 43 sends electrical current information to the control unit 41. This information may include total consumption of power, amps, Kw, Kwh, volts and any other vital electrical information. This information is immediately processed and stored in the main processor of control unit 41. The electromagnetic pickup device 43 sends data to the control unit 41 on all imbalanced phases of electricity as well as all spikes and surges in electrical current. This information is then recorded, processed and stored for reference in the event of a response, if these irregularities recur. If the control unit 41 detects through the electromagnetic pickup device 43 that there is a load on, for example, breaker 15 (e.g., a customer's refrigerator), the control unit 41, within a microsecond, switches on the refrigerator savings device, i.e. module 45, to effectuate more economic electrical energy consumption.

Electromagnetic Pickup Device

The electromagnetic pickup device 43 is a series of electronic chokes which monitors various types of electrical current being transmitted through it. The chokes (or inductors) are located in the electromagnetic pickup device 43. This electromagnetic pickup device 43 is installed alongside the output wires or input wires connecting each breaker 15, 17 and 19; however, the electromagnetic pickup device 43 may be concealed in the breaker box 13. Each of the wires that presently enter the breaker box 13 will be re-routed through the electromagnetic pickup device 43. Alternatively, the electromagnetic pickup device 43 may be physically designed so as to slide under and clamp onto the individual breaker wiring without the rewiring of same. The chokes will monitor the power each second, and then download the information to the control unit 41 in a real time manner. If, however, the electromagnetic pickup device 43 senses any change or irregularity in the electrical current, it will alert the control unit 41 within one microsecond for the proper response.

The electromagnetic pickup device 43 does not contact any of the wires in the breaker box 13 and there is no heat generated by the electromagnetic pickup device 43. This is an important characteristic of the device because it would facilitate installation without in any way physically intruding upon or damaging the existing wires or equipment.

As mentioned, the type of information the electromagnetic pickup device 43 sends to the control unit 41 includes total consumption of power, amps, Kw, Kwh, volts, and imbalanced phases of electricity, as well as all spikes and surges in electrical current. The method by which the information is gathered and transmitted will be programmed so as to obtain continual or continuous readings and to recognize various changes and situations requiring adjustment to enhance economic consumption of electrical power.

Modules

Each of the external modules 45, 47, 49 and 51 is a combination of a circuit coupled with a series of electronic metal oxide varistors. The modules will save energy by reducing and filtering the naturally created "harmonic" noise in an electrical device. This harmonic noise is not only reduced, but the module also balances the electrical phases of the device it is controlling. These two functions can reduce the electrical consumption of most electrical devices by 15% to 35%.

External Plug Module

The external module or external plug module is a device for plugging into an outlet and into which the plug of an appliance or electrical device is inserted. Alternatively, for devices or appliances with no plug, may be wired into the wiring of the device or appliance at its location.

In one embodiment, the external plug module is basically an oversized plug, 2 inches wide, 2 inches deep, and 4 inches long. The device incorporates a built-in female connection. To install, one connects the appliance or electronic device to the external plug module and then plugs it into the typical electrical outlet. Once installed, the external plug module awaits the code sequence from the control unit 41 to begin the savings sequence. This code is transmitted through the facility's or home's electrical systems through a data modulating protocol.

All presently available capacitor savings devices actually consume power if there is no electrical draw on the devices to which they are connected. However, this new method will save power and begin its savings sequence only when the control unit 41 sends a code to do so.

This transmitted code can provide functions in addition to energy savings. There may be one code for energy savings, another code for power "on" and yet another code for power "off". All codes are sent to the external plug module based on the processed information in the control unit 41.

Figure 3:
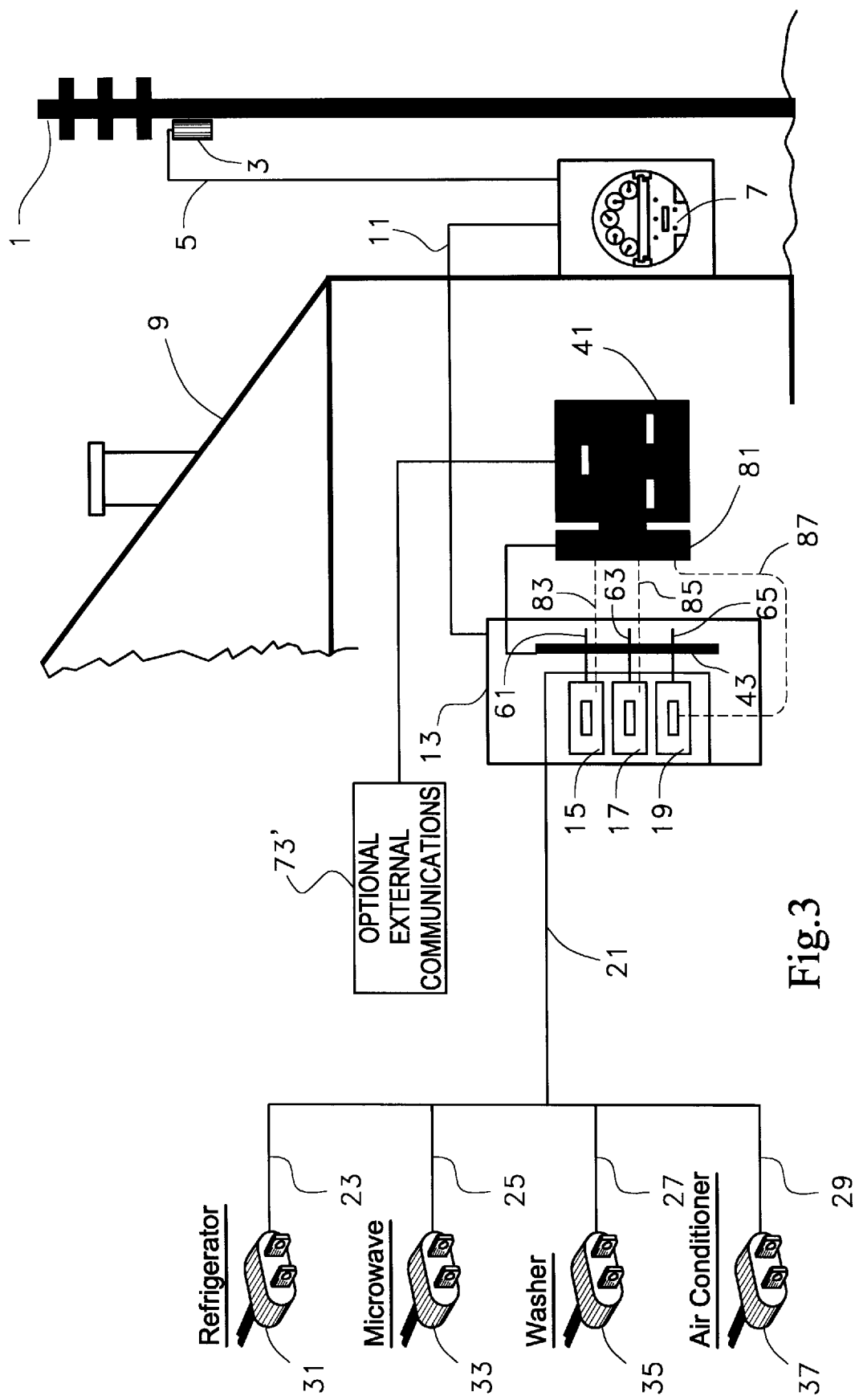
FIG. 3 shows a schematic illustration of a present invention system for conserving energy consumption utilizing internal modules.

FIG. 3 shows a schematic illustration of a present invention system for conserving energy consumption utilizing internal modules. The typical electrical power arrangement illustrated in FIG. 1 is repeated in FIG. 3 with identical parts identically numbered. Additionally, control unit 41 and electromagnetic pickup device 43 are shown as in FIG. 2. This embodiment of FIG. 3 utilizes internal module array 81, instead of individual external modules, as shown in FIG. 2.

Internal Module

The internal module 81 performs the same functions as the collection or plurality of external plug modules described above, but from a different, single location. There are many instances in which the external plug modules cannot be installed due to a very large load or a restriction to the load area. In these cases it is more appropriate to implement an internal module. This internal module is identical in function; however, it is installed in one central location, usually mounted between the control unit 41 and the customer's breaker box 13, as shown. At this location, the internal module would be connected directly to the breaker box 13. If the electromagnetic pickup device 43 is connected only by physical external contact for flux measurement, and no direct contact with wiring, then separate wiring such as 83, 85 and 87 may be required. In those cases where the electromagnetic pickup device 43 is wired directly through the internal module 81, the internal module 81 will not require separate wiring.

The internal module is more appropriate than the external plug module for commercial applications. For example, very large walk-in refrigerators in a restaurant basement would not be "plugged in" with an external plug module but, instead, would be "hard wired" with the internal module. The internal module is then controlled at the electrical breaker point of contact. The internal module would be located near the control unit 41 instead of near the load (appliance).

Figure 4:
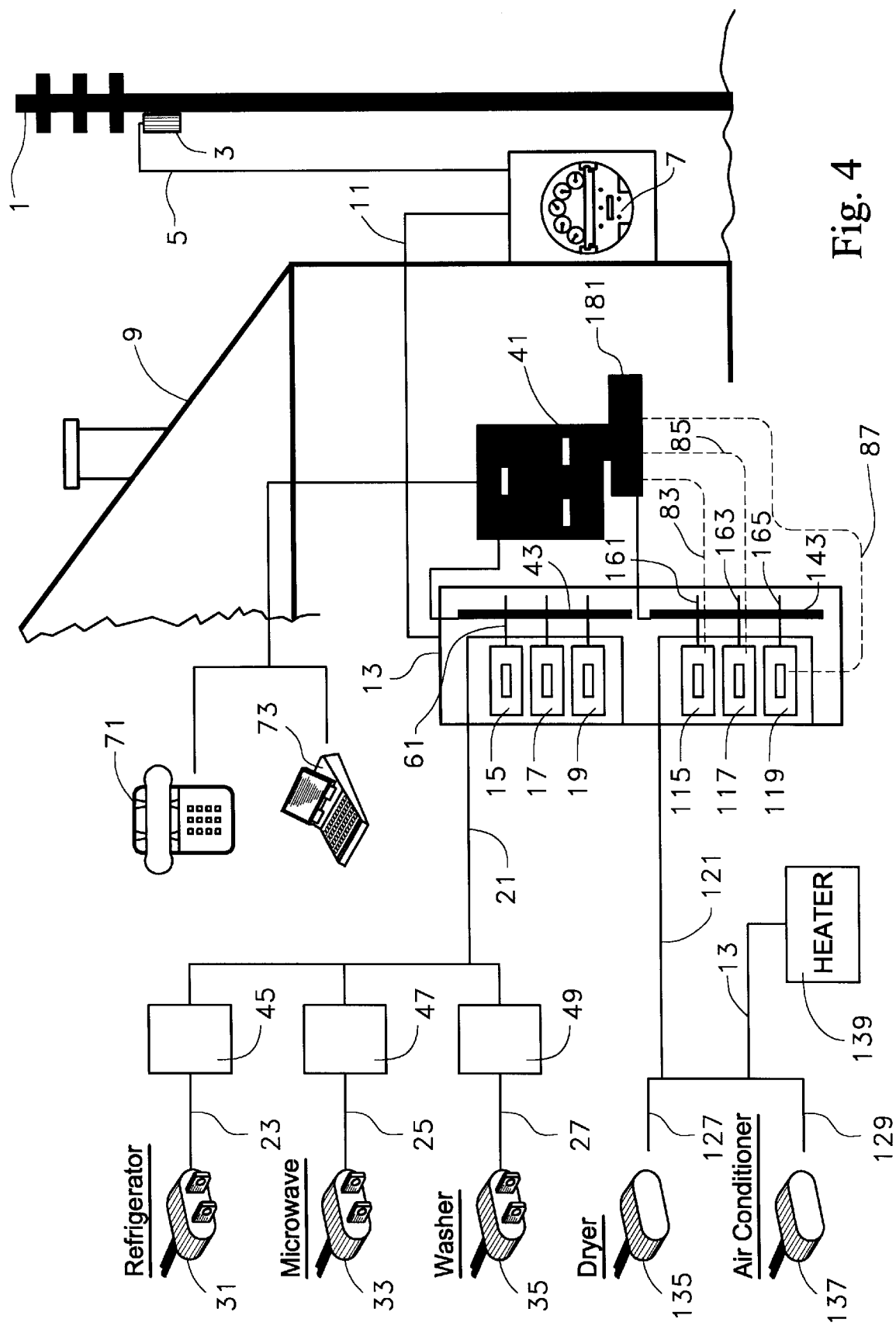
FIG. 4 shows a schematic illustration of a present invention system for conserving energy consumption utilizing both internal modules and external modules.

FIG. 4 shows a schematic illustration of a present invention system for conserving energy consumption utilizing both internal modules and external modules. The typical electrical power arrangement illustrated in FIG. 1 is repeated in FIG. 4 with identical parts identically numbered. FIG. 4 contains many of the elements which are also shown in FIGS. 2 and 3 and, where possible, identical items are identically numbered. That, in FIG. 4, there are six breakers, including breakers 115, 117 and 119 and that there are two output wiring sections which include wiring 121 with connections 127, 129 and 131, connected to devices 135, 137 and 139, respectively. In this partial embodiment, the control unit 41 has sufficient microprocessing and software capabilities to control both the internal module 181 and the external modules 45, 47, and 49. Further, two separate electromagnetic pickup devices, 43 and 143, are utilized.

Figure 5:
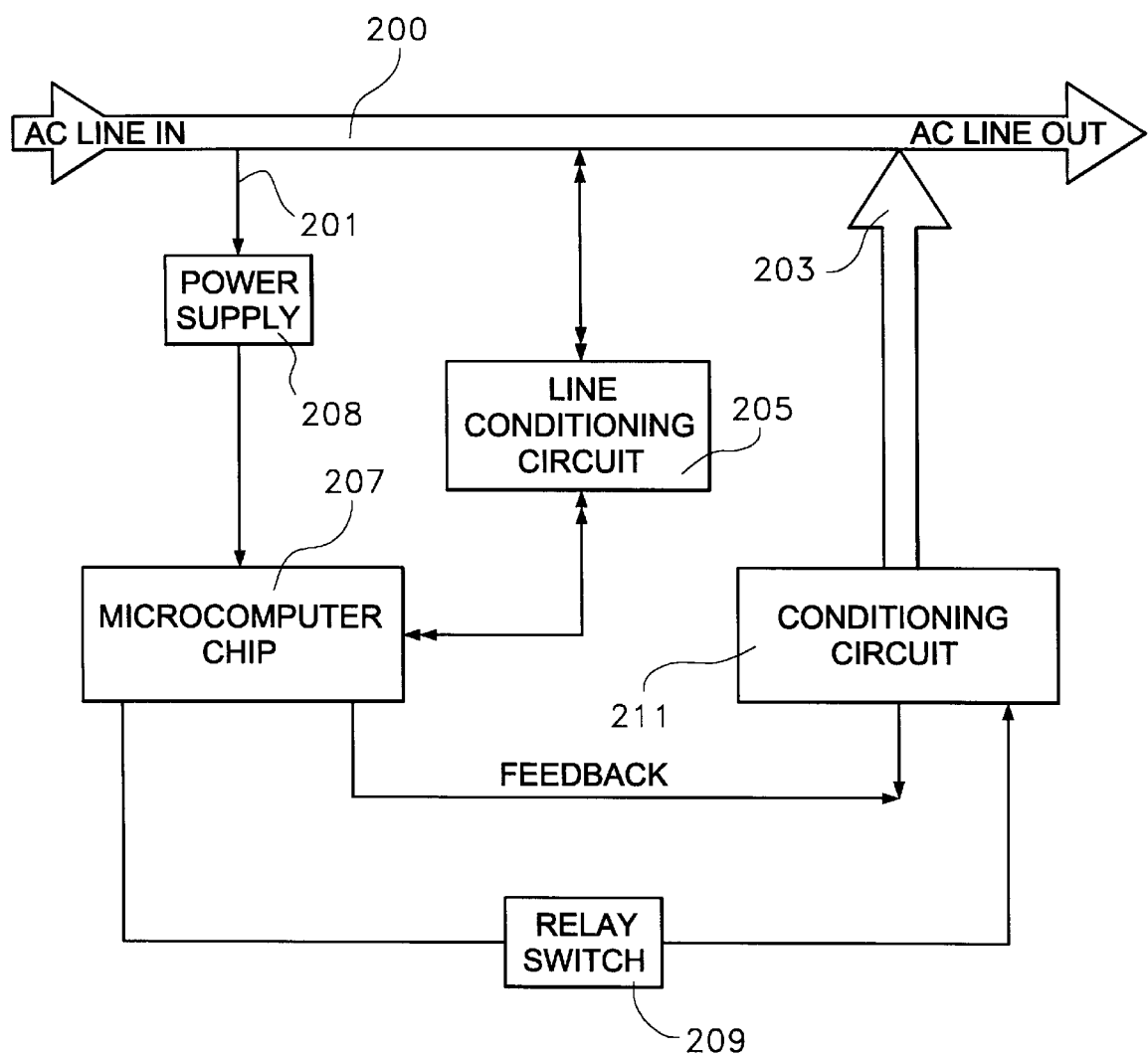
FIG. 5 shows a block diagram of the electrical arrangement for a module, whether internal or external; and, FIG. 6 illustrates a conditioning circuit circuitry diagram for the preferred embodiment module arrangement illustrated in FIG. 5.

FIG. 5 shows a block diagram of the electrical arrangement for a module, whether internal or external. There is shown in FIG. 5, the details of one embodiment of modules used in the present invention. Such modules would be connected to incoming AC line 200 at connection 201 and at the outgoing AC line at connection 203, as shown. Line connection circuit 205 would be connected to AC line 200 and to a microcomputer control chip 207, which itself would be connected to the power supply 208. Microcomputer chip 207 is connected to relay switch 209 (15 amps), which itself is connected to the conditioning circuit 211 in the manner shown. Conditioning circuit 211 is shown in greater detail in FIG. 6. Additionally, conditioning circuit 211 provides feedback to microcomputer chip 207, as shown.

Figure 6:
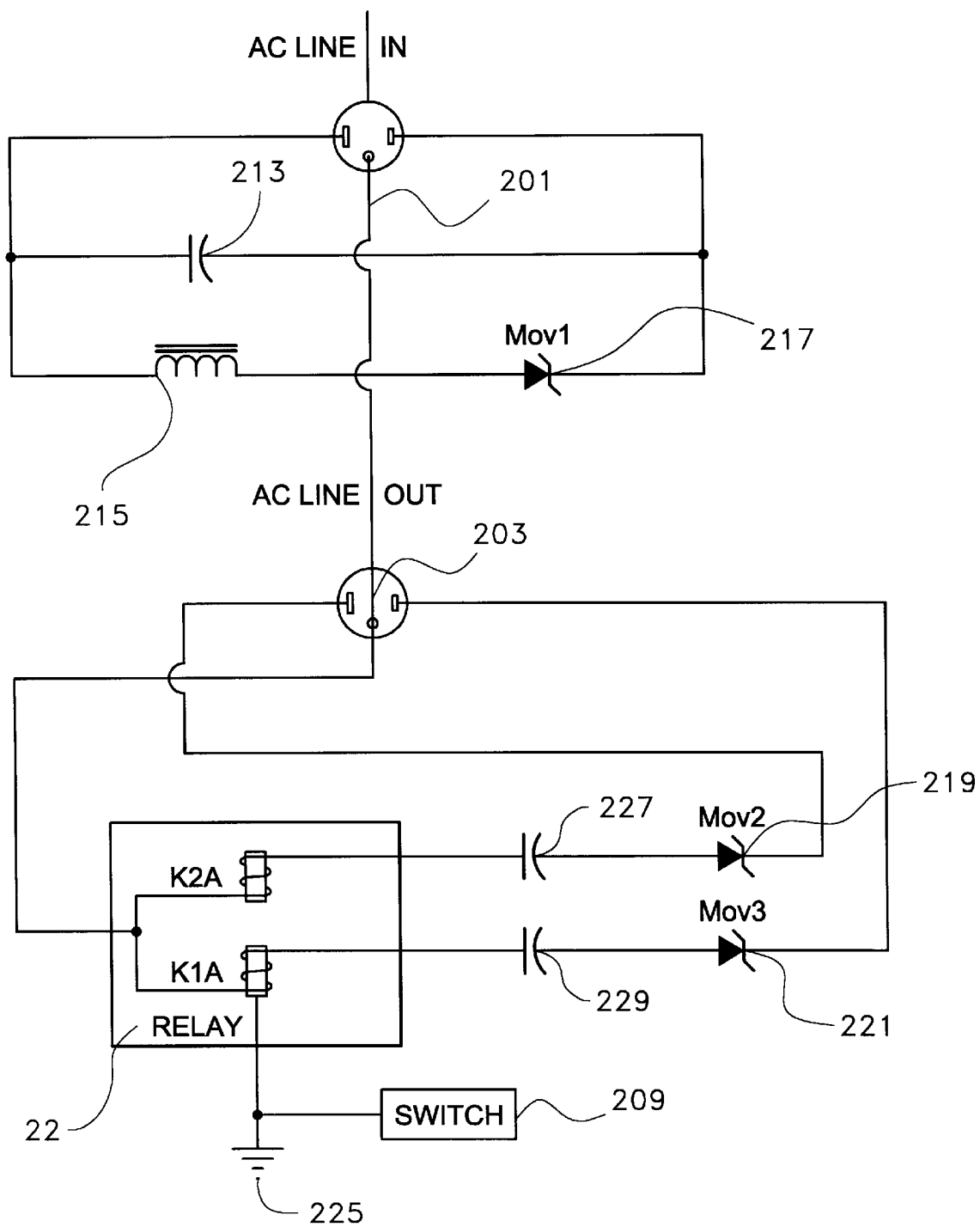

FIG. 6 illustrates conditioning circuit circuitry diagram for the preferred embodiment module arrangement illustrated in FIG. 5. Incoming AC line 200 at connection 201 and at the outgoing AC line at connection 203 are shown in FIG. 6 wherein the conditioning circuitry includes a capacitor 213 connected thereto as shown. In this embodiment, it would be a five microfarad capacitor at 250 volts. Choke 215 (inductor) is connected as shown in series with metal oxide varistor 217. Choke 215, in this embodiment, is a 680 microhenry inductor and metal oxide varistor 217 is a limiting varistor at 130 volts. Likewise, metal oxide varistors 219 and 221 are similar thereto. Double pole relay 223 is initiated by relay switch 209. The circuitry is grounded at ground 225. The relay wiring is connected through metal oxide varistors 219 and 221 as well as capacitors 227 and 229, as shown. Capacitors 227 and 229 both have a 1.0 microfarad capacity at 250 volts.

Software

The software of the present invention system within the control unit 41 is the lifeline of the entire system; it may integrate the home computer, the Internet, the server interface (for electrical retail purposes) and all other vital functions of the present invention system. This software may be developed in Visual Basic, a Microsoft product, Assembly Basic, and many other protocol languages used in programming. The user-friendly screen, designed to switch devices on and off, is interconnected with the software and is modular.

The code sequence to perform a function through the control unit 41, in secured embodiments, must match the code sequence previously downloaded into the control unit 41. If the two code sequences do not match, the system cannot be operated. Accordingly, in the event that the software is reproduced without authorization, it is useless without the control unit 41 code sequences. In the event that the sequences are misappropriated and the software is reproduced, the operator can download new sequences to the control unit 41 at will or change them automatically, e.g. weekly, if necessary. This affords the software system greater protection.

The alternating current control feature of the present invention system involves communication to relay energy supplied to a given facility or given home. The present invention measures the total line current in a given location at circuit breakers which is accomplished by the computer storage control unit 41 and an electromagnetic-induced-pickup device 43 for each black wire to the breakers in a given control box. Each set breaker with AC power reading with current-sensing means sets a voltage to the control unit 41 for its readings given in real time response for the unit for storage. The control unit 41 at given commands via a front control panel, computer or via a modem, may display total power consumption from its microprocessors in the unit and may display this information, e.g. by L.B.D., and/or transmit it over standard phone lines. The data can be processed by a central office for energy enhancements and the control unit 41 can respond for a change. The unit can be reprogrammed at any given time for controlling the controlled given breaker for a time on or off response for more energy savings. The unit ability of processing the energy used in amps, kW, and energy saved can increase one saving at a given location by the ability or expandability to perform smart functions as dimming lights, controlling air conditioning, or motors.

The Control Apparatus for Transceiver

Communications of alternating current/monitoring and controlling devices is described as a communication device to store and communicate energy supplied to a given module. This invention monitoring the total line current in a given location assisted by a computer control unit 41 and a bi-directional pulse modulating communication transceiver micro computer device for each given control unit 41. The control unit 41 at a given command via pulse modulating command set will instruct the module, such as module 45, to be turned on at a given time when the power filtering requires or when the line is in a stable condition. The unit can be reprogrammed at any given time for controlling the given module for a time on or off response for more energy savings. The control unit 41's ability to process energy used, will enhance energy savings and can increase savings at separate, given locations by its ability to perform unique, separate functions.

System Operation Examples

The following are two examples of how the system would operate on a day-to-day basis in a typical home:

EXAMPLE 1

Bob leaves work, notices that it is a very hot day and realizes that he did not activate his residential air conditioning before leaving home. With the present invention system, Bob can access his control unit through a laptop or his telephone line. Bob can direct the control unit, through the software, to send a power "on" code to his home air conditioning system with one mouse click. The control unit sends two simultaneous codes to the air conditioning system—one to switch the units "on" and the other to begin instantly the savings sequence for the air conditioning system. The external plug module then reads these codes, releases power to the air conditioning system and starts a savings sequence.

EXAMPLE 2

Bob is now home and preparing dinner. Bob's first reaction would be to open the refrigerator. Once open, the inside of the refrigerator starts to rise in temperature because of the kitchen surroundings. As soon as the compressor in the refrigerator switches "on" to re-cool the refrigerator, there is a draw which is detected by the electromagnetic pickup device on the refrigerator breaker. The electromagnetic pickup device then sends this new electrical draw data to the control unit. The control unit responds by sending the appropriate code down to the external plug module attached to the back of the refrigerator to start a savings sequence because of the electrical draw. This sequence remains in effect until the compressor shuts down or the refrigerator is reopened. As Bob switches on the microwave, the same chain of events is initiated with respect to that appliance.

With the system there are constant power savings being generated as Bob uses the items in his home or commercial facility. These savings are in real time and can be accurately measured. Once the system is installed, savings begin immediately. An average monthly electric bill of $140.00 should be reduced to $105.00 in a worst case; to $84.00 in a best case.

Obviously, numerous modifications and variations of the present invention are possible in light of the above teaching. It is therefore understood that within the scope of the appended claims, the invention may be practiced otherwise than as specifically described herein.

What is claimed is:

1. A system for monitoring and controlling electrical power consumption to be retrofitted to an existing consumer electrical power arrangement including an electrical feed line from a provider, a meter, a circuit breaker and individual output wiring to a plurality of electrical devices, appliances and outlets, which comprises:

(a) a control unit having means for receiving information from an electromagnetic pickup device from which real time electrical consumption is determined, from which current and subsequent voltage are monitored, said control unit including a main data processing and storage microprocessor for retaining information and including a communications microprocessor for processing and sending signals to modules;

(b) an electromagnetic pickup device adapted to be connected to the output side of wiring of individual circuit breakers for measuring the electromagnetic flux emanating at each output wire from each of said individual circuit breakers in a breaker box, said electromagnetic pickup device being connected to said control unit for providing electromagnetic flux measurements thereto; and, (c) a plurality of modules connected to wiring to selected electrical devices, appliances and outlets and being electronically connected to said control unit through normal electrical wiring, each of said plurality of modules corresponding to an individual circuit breaker electromagnetic flux reading storage site of said control unit, each of said modules having electrical power filters for release of power to the individual electrical devices appliances and outlets to which they are connected.

2. The system of claim 1 wherein said control unit includes a third microprocessor for external communications.

3. The system of claim 1 wherein said modules are external plug modules to be plugged into common plug outlets and adapted to receive plugs of common electrically operated devices and appliances.

4. The system of claim 1 wherein said modules are internal modules and adapted to be mounted in a central location located between said control unit and common electrical connection.

5. The system of claim 1 wherein said modules include both external plug modules and internal modules.

6. The system of claim 1 wherein said electromagnetic pickup device comprises a main support structure, a plurality of individual flux density measuring means and wiring from each of said flux density measuring means to said control unit.

7. The system of claim 6 wherein said individual flux density measuring means are adapted to be functionally connected for said output side wiring of said individual circuit breaker.

8. A system for monitoring and controlling electrical power consumption to be retrofitted to an existing consumer electrical power arrangement including an electrical feed line from a provider, a meter, a circuit breaker and individual output wiring to a plurality of electrical devices, appliances and outlets, which comprises:

(a) a control unit having means for receiving information from an electromagnetic pickup device from which real time electrical consumption is determined, from which current and subsequent voltage are monitored, said control unit including a main data processing and storage microprocessor for retaining information and including a communications microprocessor for processing and sending signals to modules;

(b) an electromagnetic pickup device adapted to be connected to the output side of wiring of individual circuit breakers for measuring the electromagnetic flux emanating at each output wire from each of said individual circuit breakers in a breaker box, said electromagnetic pickup device 43 being connected to said control unit 41 for providing electromagnetic flux measurements thereto;

(c) a plurality of modules connected to wiring to selected electrical devices, appliances and outlets and being electronically connected to said control unit through normal electrical wiring, each of said plurality of modules corresponding to an individual circuit breaker electromagnetic flux reading storage of said control unit, each of said modules having electrical power filters for release of power to the individual electrical devices appliances and outlets to which they are connected; and, (d) external communication means connected to said control unit to permit externally initiated all adjustments to said control units by users.

9. The system of claim 8 wherein, said communication means is adapted for external operation by a user to override selected features of said control unit for the purpose of modifying signals from said control unit to said plurality of modules.

10. The system of claim 8 wherein said communication means includes one or more remotely located computers.

11. The system of claim 8 wherein said communication means includes connection to a telephone line for wide area network communications.

12. The system of claim 8 wherein said communication means includes both one or more remotely located computers and a connection to a telephone line for wide area network communications.

13. The system of claim 8 wherein said modules are external plug modules to be plugged into common plug outlets and adapted to receive plugs of common electrically operated devices and appliances.

14. The system of claim 8 wherein said modules are internal modules and adapted to be mounted in a central location located between said control unit and common electrical connection.

15. The system of claim 8 wherein said modules include both external plug modules and internal modules.

16. The system of claim 8 wherein said electromagnetic pickup device comprises a main support structure, a plurality of individual flux density measuring means and wiring from each of said flux density measuring means to said control unit.

17. The system of claim 16 wherein said individual flux density measuring means are adapted to be functionally connected for said output side wiring of said individual circuit breaker.

* * * * *